United States Patent [19]

Ozimec

[11] 4,125,216
[45] Nov. 14, 1978

[54] APPARATUS FOR ACCOMPLISHING SOLDER BONDING

[76] Inventor: Stephen Ozimec, 33391 Padina Cir., Laguna Niguel, Calif. 92677

[21] Appl. No.: 757,067

[22] Filed: Jan. 5, 1977

[51] Int. Cl.² ............................................. B23K 37/04
[52] U.S. Cl. ...................................... 228/4.5; 29/759; 29/760; 228/44.1 A; 269/41; 269/254 R
[58] Field of Search ......................... 228/4.1, 44.1, 4.5, 228/6 A, 122, 123, 179, 180; 269/41, 254 R; 29/628, 759, 760

[56] References Cited

U.S. PATENT DOCUMENTS 2,584,297  2/1952  Schmuldt ......................... 228/4.1 X Primary Examiner—Donald G. Kelly
Attorney, Agent, or Firm—Grover A. Frater

[57] ABSTRACT

Conductor wires are laid in parallel, one between a respectively associated pair of the coils of a helically wound coil spring while the coils are separated. Thereafter, the coils are moved together so that the conductor wires are pinched between them. One end of each of the wires is fluxed and then tinned with solder in dipping steps. Subsequently, the conductor wires are disposed in respectively associated ones of a series of parallel grooves formed in a conductor holder. The grooves are directed toward cavities in which elements to which the wires are to be bonded are suspended. The conductors are urged into engagement with those elements and hot air is made to flow into the cavity where the solder tinning is rendered molten whereby solder bonding is effected when the supply of hot air is terminated. The process is facilitated by the use of stops in conjunction with a coiled spring such that the conductor wires have their ends arranged in a common line prior to dipping and tinning. The process is further facilitated by employment of a conductor retaining element in conjunction with the wire holding element. The retaining element rests atop the holding element so that the conductors are confined against all but longitudinal movement through the grooves in the direction of the electrical elements to which they are to be bonded.

13 Claims, 13 Drawing Figures

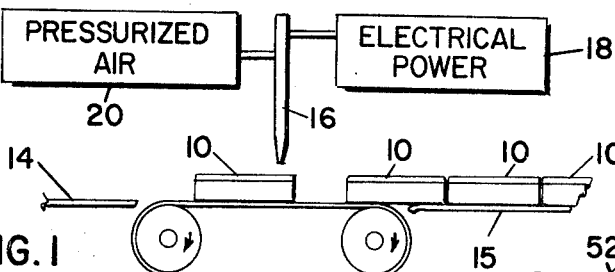
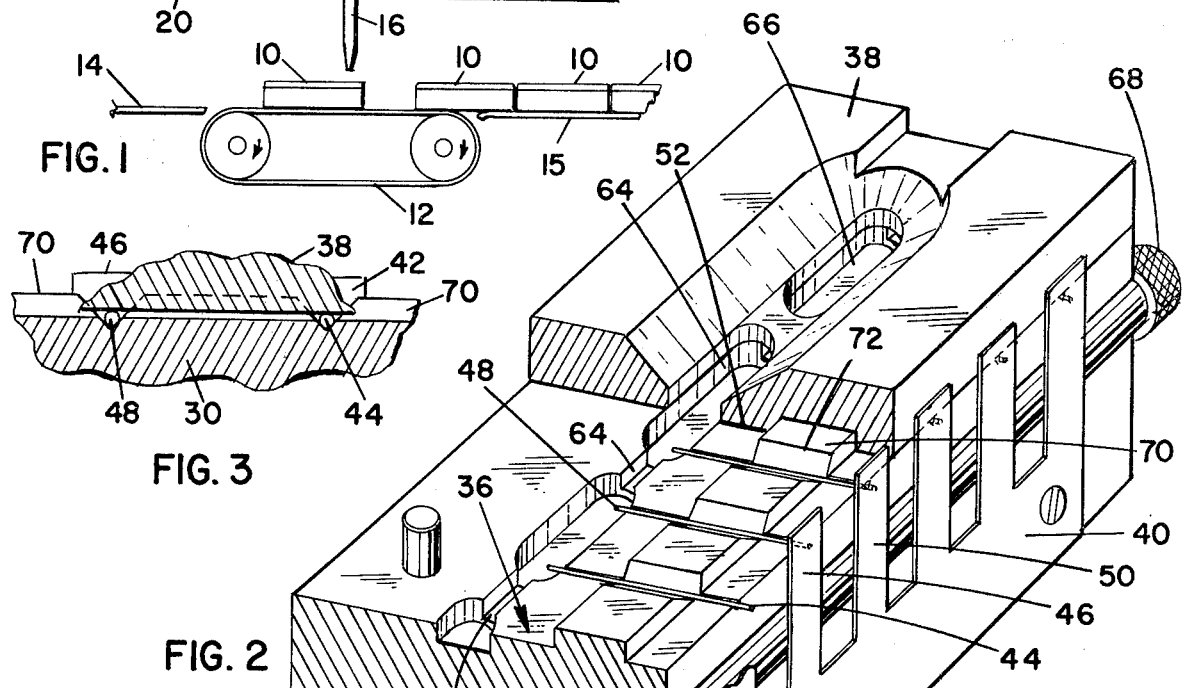
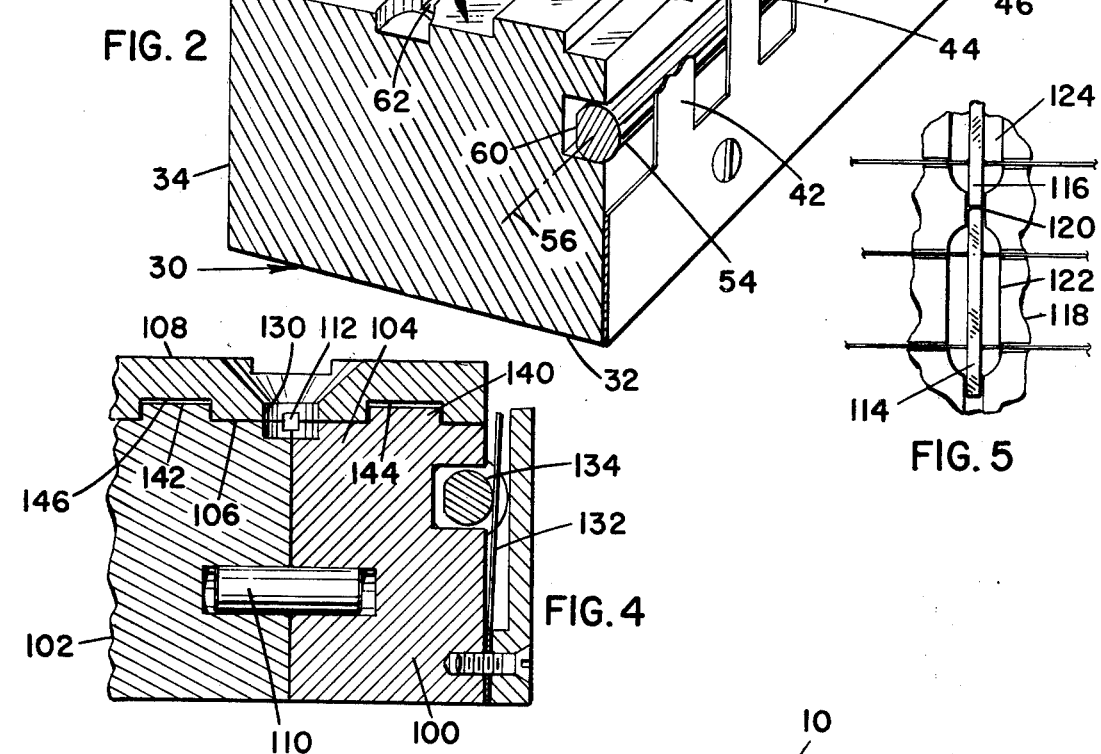
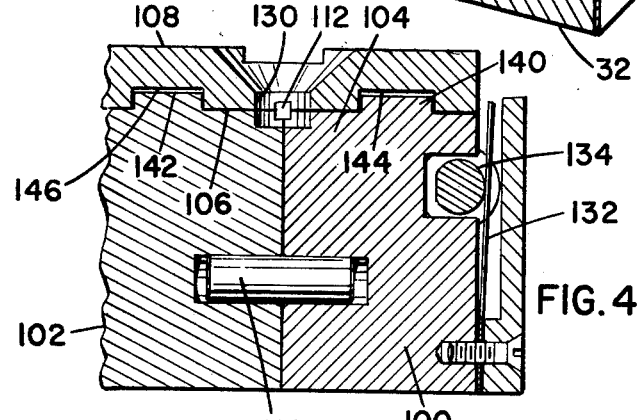
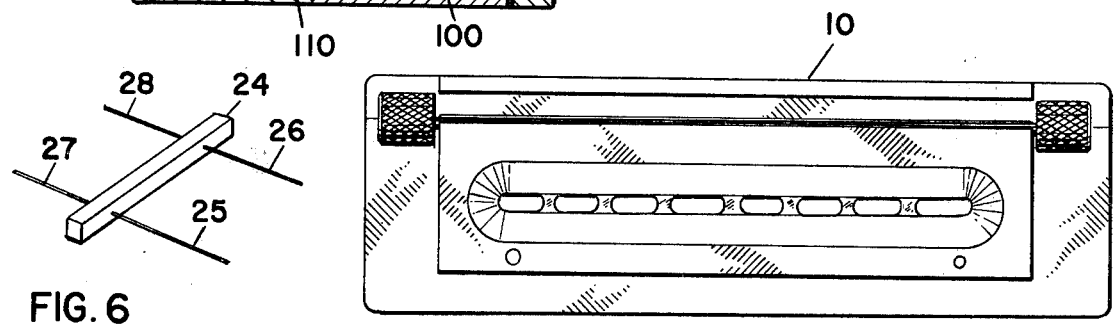
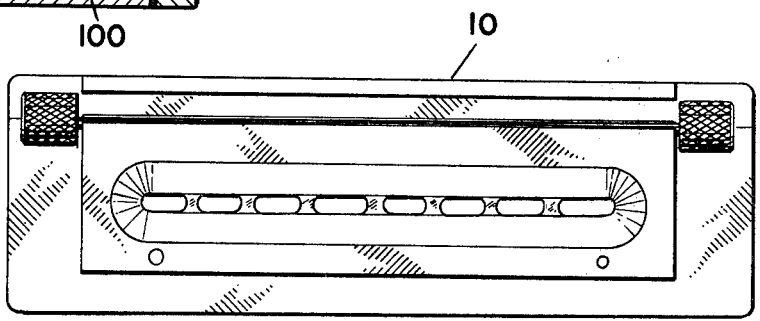

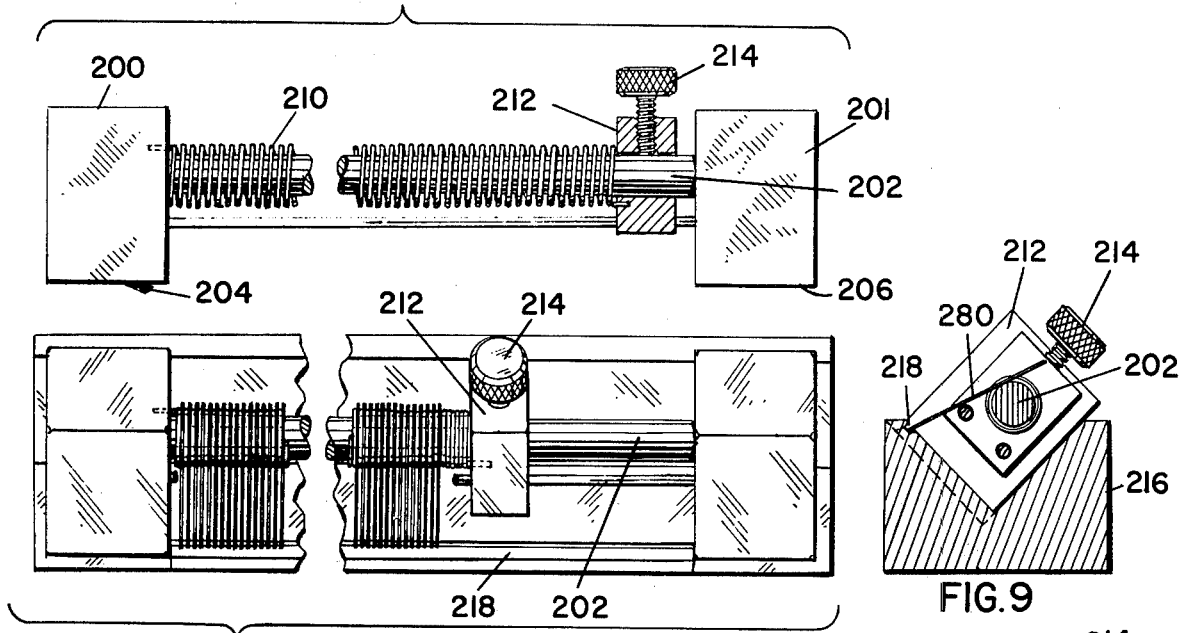
FIG. 8
FIG. 10
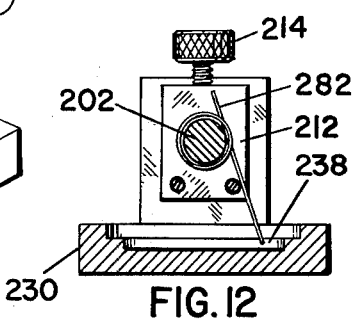
FIG. 9
FIG. 12
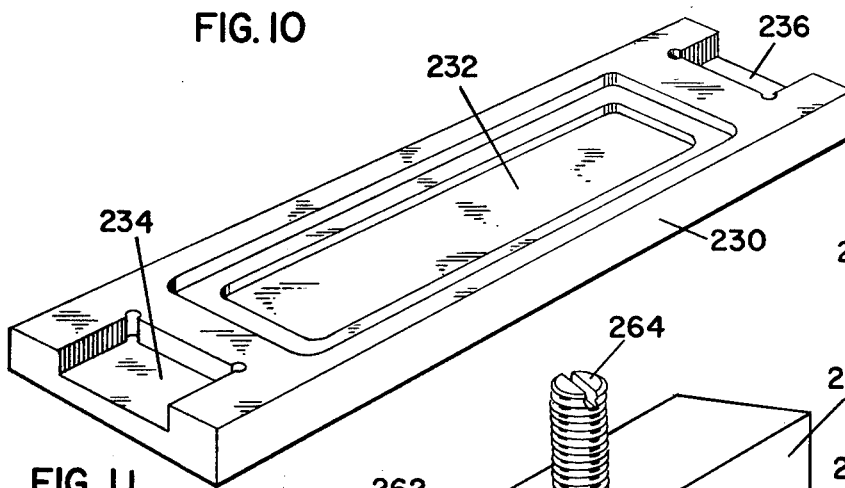
FIG. 11
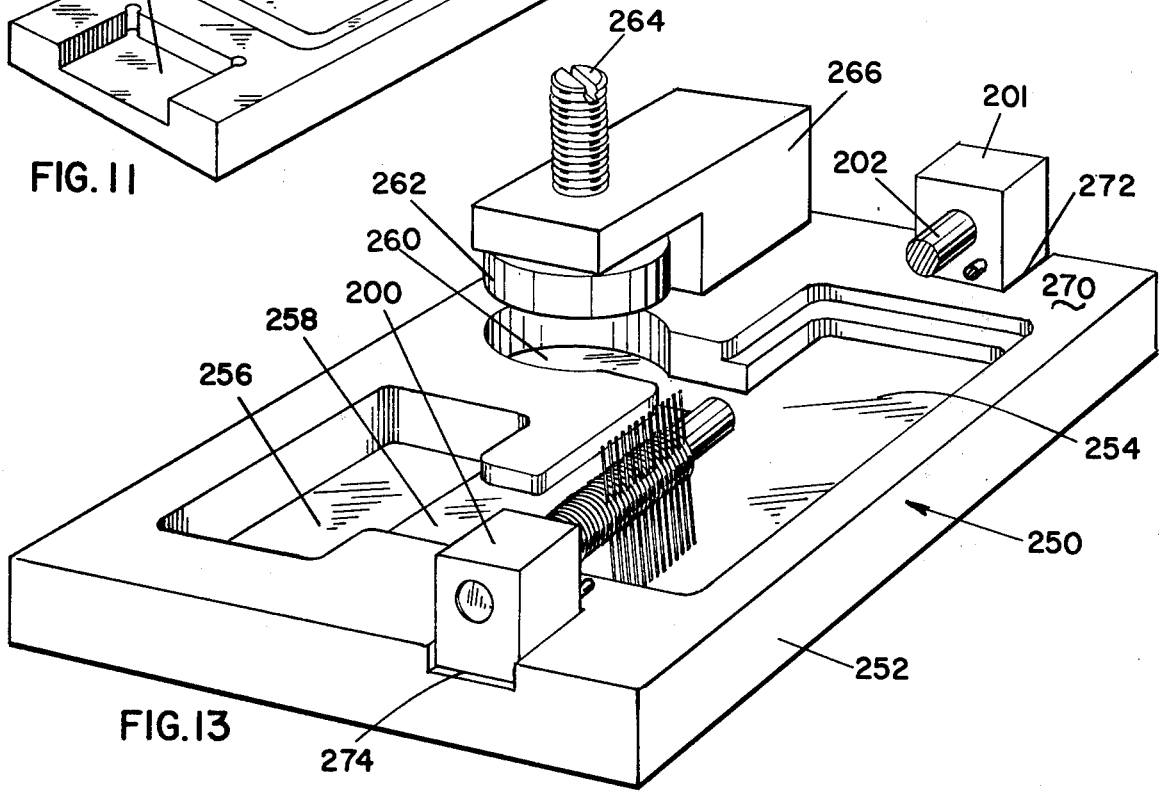
FIG. 13

APPARATUS FOR ACCOMPLISHING SOLDER BONDING

This invention relates to improved means for the bonding by soldering of one element to another. While the invention is not limited thereto, it is particularly well suited to the bonding of conductors, and particularly wires, and to electrical apparatus such, for example, as metalically plated, semi-conductor structures and piezo-electric crystals.

BACKGROUND OF THE INVENTION

There are some solder tasks in which a conductor is to be bonded to another element which are very difficult to accomplish because of a need for exact placement of the conductors, or because of a need to limit the amount of solder that is employed, or simply because of the small physical size of the elements that are to be bonded. The problem is particularly severe in the bonding of conductor wires to a piezo-electric crystal. The wires that are bonded to such crystals may be employed as electrical conductors or to provide a means for mounting the crystal, or to both. Sometimes the wires are laid with a portion of their ends flat against the surface of the crystal, and sometimes they must be butt-bonded to the crystal. Butt-bonding is particularly difficult. The bond is usually made exactly at a nodal point, and it must be made with a minimum solder. In one example, the crystal employed in certain crystal controlled wrist watches is formed as a rectangular bar which oscillates such that there are two nodal points along its length. In one version, two wires are bonded to the same side of the bond at each of the nodal points. In another version, a second pair of wires is bonded at the nodal points at the opposite side of the crystal.

It has been the practice to hold the crystal in a fixture at which a source of heat is available. Conductor wires are picked up one at a time. An end is dipped into flux, and then into a molten solder pot so that the end of the wire is tinned. That wire is then placed in a fixture in line with the point on the crystal to which it is to be bonded. Thereafter, some biasing means is employed for pushing the wire into engagement with the crystal. The plating on the crystal surface and the wire tinning are heated sufficiently so that solder flows to the plating on the crystal surface. Upon removal of the heat, the solder solidifies and the bond is completed.

While the methods and the apparatus that have been employed to perform that task have produced satisfactory products, they have not permitted anything approaching mass production. Labor costs, non-uniformity, and the chance for error have been great. It is the purpose of this invention to provide apparatus which overcome that difficulty in large degree.

SUMMARY OF THE INVENTION

This invention provides apparatus by which a number of conductors are fluxed and tinned together in like degree. For convenience, the conductors will be called wires herein, but it is to be understood that the invention is applicable to conductors having other geometrical configuration.

The conductors are placed and held in a fixture such that they are held in parallel, and such that the ends to be fluxed and tinned lie in a common line whereby all of the wires may be dipped in liquid flux and dipped in molten solder simultaneously and in equal degree.

While not necessary to successful practice of the method of the invention, it is a feature of that apparatus that the wires may be arranged so that the spacing between them corresponds to the spacing of the grooves formed in a wire holder in which they are lodged during the actual bonding process.

The fluxing and tinning fixture comprises a helically wound, coiled spring the coils of which may be pulled apart and compressed selectively. Conductor wires are laid between apirs of adjacent coils of the spring while the coils are separated. Then the spring coils are compressed so that the wires are pinched in place. That spring structure is combined with a pair of stops arranged so that the wires will lie parallel to one another in a common plane, and so that at least one end of all of the wires will lie in a common line when the coil turns are compressed to pinch them. Thus arranged, all of the wires may be treated simultaneously, and they can be given like treatment.

After having their ends fluxed and tinned, the wires are placed in a second fixture such that they lie in parallel grooves with their tinned ends directed towards the piezo-electric crystals or other elements to which they are to be bonded. Those elements are held in an element holder such that the point at which the wire to be bonded lies in line with the groove in which the wires be bonded lies in line with the groove in which the wires rest. A means is provided for urging all of the wires into contact with their respective bonding points at the same time. A retaining means is provided to confine movement of the wires to a longitudinal movement in the direction of the groove, and, in particular, toward the point at which bonding is to occur.

The wire holder is arranged so that is can receive a plurality of wires. In one form of the invention, the wires need not be removed from the spring holder. However, in the preferred form of the invention, they are transferred from the spring to the grooves in the wire holding structure. That can be done manually, one at a time, if preferred, or the wires can be placed in the spring holder so that they have a spacing corresponding to the spacing of the grooves in the wire holder, in which case a plurality of wires can be transferred from the spring fixture to the wire holder simultaneously.

The wire holder is part of a bonding apparatus that includes, in addition to the wire holder, a means for holding the elements to which the wires are to be bonded. Those two holding elements can be integrally formed, or they can be formed as an assembly of a number of sub-units. The apparatus further includes a means for retaining the wires in the wire holder against all but longitudinal movement along the grooves. It is preferred that that means be separable from the others, or at least moveable relative to them so that the conductor wires may be simply laid in place in their respectively associated grooves. A means is provided for urging the wires to move through the grooves into engagement with the elements to which they are to be bonded. In preferred form, that means comprises a plurality of cantilevered springs. One spring is provided for each wire whereby small changes in wire length are accommodated while insuring that substantially equal pressure is applied in abutting each wire to the point at which it is to be bonded.

A number of advantageous features are provided and may be incorporated in the structure. Thus, it is advantageous that each element to which the wires are to be bonded be disposed in its own cavity where it is suspended so that air can flow around it in the vicinity of the bonding points. Bonding is accomplished by introducing hot air into that cavity at a temperature, and in a quantity, sufficient to melt the solder tinning and to cause it to flow to the element to which the wire is to be bonded. In some cases, the element to which the wire will be bonded is itself tinned, and, in that case, the tinning on both parts is rendered molten.

In a preferred form of the invention, the passageway by which air is brought to the cavity where bonding is accomplished is formed in the retaining element. That arrangement makes it possible to form the cavity in which bonding will occur so that it is easily accessible whereby to facilitate loading of the piezo-electric crystals or other elements.

Another feature of the invention is the employment of a structure whose purpose is to facilitate loading wires onto the holder. In preferred form, that structure is integral with, or fixed to, the wire holding member in which the grooves are formed. That structure may have the form of a rib or bar which extends upwardly from the grooved surface of the wire holder and is itself formed with grooves the lower portions of which are coincident with the grooves in the surface of the wire holding element. Alternatively, a separate structure may be provided at each groove or groups of grooves. Since the structure stands upwardly from the grooved surface, the grooves formed therein are necessarily wide whereby it is easy to locate the wires and so that they are guided into the grooves of the wire holding element. In the preferred form of the invention, that structure, or structures, are located intermediate the length of the groove that is formed in the upper surface of the holding element. The retaining means is formed with a recess so that it straddles those loading facilitating structures and serves to retain and confine the wires to the grooves of the holding element on both sides of the structure.

These and other novel and advantageous features of the invention will be more easily understood from the description of a specific embodiment of the invention which follows.

That embodiment is shown in the drawing in which:

FIG. 1 is a schematic diagram of a soldering apparatus being conveyed past a source of heated air on a conveyor;

FIG. 2 is an isometric view, shown partly in section, of a soldering fixture according to the invention;

FIG. 3 is a diagram, shown partly in section, illustrating the inner action between a wire holding member and a wire retaining member;

FIG. 4 is a cross-sectional view of a modified form of the apparatus shown in FIG. 2;

FIG. 5 is a fragmentary view illustrating how piezo-electric crystals for digital watches are loaded into the apparatus of FIG. 4, and how wires are bonded to them;

FIG. 6 is an isometric view of a completed digital watch crystal with four wires bonded to it;

FIG. 7 is a top plan view of the bonding fixture shown in FIGS. 1 and 2;

FIG. 8 is a fragmentary, partially sectioned, view of a wire holding fixture according to the invention;

FIG. 9 is an end view, partly in section, of the fixture of FIG. 8 associated with a loading fixture;

FIG. 10 is a fragmentary, top plan view, of the apparatus of FIG. 9;

FIG. 11 is an isometric view of a liquid flux holder;

FIG. 12 is a view, partly in section, illustrating how the fixture of FIG. 8 is associated with the flux holder of FIG. 11; and FIG. 13 is an isometric view showing a molten solder holder and a fragment of the fixture of FIG. 8.

DESCRIPTION OF THE PREFERRED EMBODIMENT

The method involves a number of steps, each of which has separate utility and all of which have utility in combination with one another. FIG. 1 illustrates how the last step may be practiced.

A number of crystal and wire holding fixtures 10 are conveyed by a belt or chain conveyor 12 from a delivery tray 14 to a storage tray 15. As they are conveyed, they are passed under a heat gun 16. That heat gun includes an electric heater powered by an electrical power source 18. The heater heats air that is delivered to the heat gun under pressure from a source 20. Pressurized air emanating from heat gun 16 is directed toward the wire and crystal holding fixture 10. Crystals, or other structures to which wires are to be bonded, are mounted in cavities within the carrier. Pre-tinned conductors engage surfaces of the crystal to which they are to be bonded. The unit 10 includes passageways by which heated air from gun 16 can flow into the cavity where the solder tinning is rendered molten and made to flow to the surface of the crystal. When the conveyor 12 moves the holder 10 to carry the crystal beyond the heat gun, the solder resolidifies and the bond is completed between the wire and the crystal.

The process is applicable to more than simple butt welding of round wires to flat surfaces of piezo-electric crystals. However, that example has been selected for illustration in the drawings, and the terms "conductors" and "conductor wires" and "crystals" will be employed to explain the invention. However, it is to be understood that those terms are intended to serve as generic descriptions of support elements as well as electrical conductors, and of a variety of geometrical shapes, and of apparatus more than only piezo-electric crystals.

One of the fixtures or carriers 10 is shown in top plan view in FIG. 7. The oval openings are passageways by which heated air from the heat gun 16 may flow down into a cavity where the soldering task is accomplished. One form of finished product is illustrated in FIG. 6. It comprises a rectangular bar 24 of piezo-electric material. While too thin to be separately identifiable in the drawing, the left and the right faces of that rectangular bar are plated with a very thin solderable metallic layer. Two straight lengths of round wire are butt-bonded to each of the right and left surfaces. Those wires may serve as electrical conductors or supporting structures, or both. The bar is square in cross-section and measures approximately 30/1000ths of an inch on the side. The wires in this case are about 3/1000ths of an inch in diameter. For identification, the wires on the right side of the bar have been given the reference numerals 25 and 26, and the wires on the left have been identified with the numerals 27 and 28.

Because of their small size and the need for cleanliness, the crystals and the wires are ordinarily handled with tweezers. An apparatus of the kind shown in FIG. 4 is suitable for making the crystal products shown in FIG. 6. The holder 10 shown in FIGS. 1, 2, 3, and 7 is suitable for producing crystals that have wires extending only from one side.

The construction of the carrier of FIG. 7 is shown best in FIG. 2. In includes a means for holding the elements that are to be soldered to the crystal or other electrical unit. For convenience, they are called conductor wires, and the component of FIG. 2 is arranged specifically for use with straight lengths of round wires. The carrier of fixture 10 also includes a means for holding a crystal or other electrical apparatus to which the conductor wires are to be soldered. In FIG. 2, the means for holding the electric apparatus and the means for holding the wires are formed integrally with one another. It is of no moment whether those two means be formed by a single structure, or two or three or more structures. It is important, however, that they be interrelated in a way so that the connector wires and the crystal will be oriented such that the wires are confined to movement toward the point on the crystal to which they are to be soldered.

The apparatus also includes a means for retaining the conductor wires in proper position during the bonding process. For purposes of identification, the combined means for holding the wire, and means for holding the electrical apparatus is identified by the reference numeral 30. The right portion 32 of that structure serves as the wire holding means, and the left portion 34 of the structure serves as the electrical element, or crystal, holding means. It is preferred, so that gravitational force may be employed in the bonding process, that the wires be held on the upper surface 36 of the wire holding means, and that that surface be uppermost and generally flat. However, it is provided with cutouts in which the wires may be laid. It is not essential that the cutouts extend the entire length of the wire to provide them with proper positioning and support. In preferred form, the cutouts have the form of grooves or notches. A groove is considered to be an elongated notch. In any event, the wire holding means is provided with surface condormations in which the wires may be lodged. They are retained there by a retaining means. In this embodiment, the retaining means comprises a plate-like member 38 whose lower surface is substantially flat. The lower surface rests atop the wire holding means to trap the wires into the respective grooves of the wire holder. It is necessary that the wires be moveable longitudinally so that their ends can be brought into abuttment with the sides of the crystal. Except for that limitation, it matters not whether the retaining means rests on the surface of the wires and holds them down in the grooves of the wire holder or, in the case in which the grooves are sufficiently large to fully contain the wires, whether the retaining means simply rests atop the wire holder to trap the wires within the holder grooves.

It is necessary to provide a means by which the wires can be brought into contact with the points at which they are to be soldered. It is also necessary to provide some means by which that contact can be maintained. Since the wires or the other structure will be pre-tinned and the solder employed to complete the bond will be derived from that tin coating, it is preferred that some means be provided for maintaining a force urging the wire into contact with the point to which it is to be bonded. This invention employs a means for accomplishing those results, and in the preferred form, that means comprises a structure by which an elastic force is applied to perform the task. In FIG. 2, that means comprises a series of cantilever springs, one associated with each of the wires, and in preferred form, those cantilevered springs are connected together in a comb-like structure 40. The foremost finger 42 has been broken away so that the right end of the first wire 44 will be visible. The next finger 46 bears against the end of the wire 48, and the third finger 50 bears against the end of wire 52. The remaining fingers of the comb are visible, but the wires are not. They are hidden from view by the wire retaining means 38.

Provision is made for moving all of the fingers simultaneously to a retracted position and for releasing them all simultaneously to bear against the end of their respectively associated conductor wires. That means may, and in this embodiment, does, have the form of a generally cylindrical rod 54 mounted on the structure 30 and rotatable upon an axis 56 that extends in a direction perpendicular to the direction in which the comb fingers extend. The axis 56 is positioned so that the cylindrical surface of the rod 54 bears against the fingers, forcing them to retracted position. However, along one side 60, the rod is flattened, and when the rod is rotated so that that flattened side faces the fingers of the comb, they are released and are free to engage the ends of the conductor wires 44, 48, 52, and all of the others, and to urge those wires toward the left to respectively associated cavities of the crystal holder 54. The crystals have been omitted in FIG. 2 so that the relationship of the wire retainer 8 to the crystal holder 34 would be more apparent. That relationship can be understood by an examination of FIGS. 2 and 4.

The apparatus in FIG. 4 is arranged so that it has two wire holders, numbered 100 and 102, respectively. Each of the wire holders is integral with half of the crystal holding means which is that region of the composite structure that lies between the wire holding means. The right portion of the crystal holder is identified by the reference numeral 104, and the left side is identifed by the reference numeral 106. In this case, the wire retainer is a larger plate 108 that overlies the wire holder at each side of the central crystal holding region. Element 110 is one of several pins that hold the structure together. The rectangular opening 112 corresponds to openings 62 and 64 of FIG. 2. That opening extends between cavities so that the end of each crystal rests in that rectangular opening and the central portions of the several crystals that are processed simultaneously are suspended across respectively associated cavities. That arrangement is best shown in FIG. 5 where two crystals 114 and 116 are shown in position looking down upon the upper surface of a crystal holder 118. The line 120 represents the joining and abutting ends of the crystals 114 and 116. Crystal 114 has its central region suspended in cavity 122, and the central region of crystal 116 is suspended in cavity 124.

Returning to FIG. 4, the square opening 112 has the same dimensions as does the crystal in transverse cross-section. The cavities that are formed in the crystal holding structure 104 and 106 extend below the opening 112 so that air is permitted to flow around and under the crystal when it is installed in the holder. A pair of wires is disposed in the unit of FIG. 4. The wire at the left is identified by the numeral 126, and the wire at the right is numbered 128.

In the unit shown in FIG. 2, all of the rectangular openings 62 and 64 are formed in the lower structure 30. In the case of the embodiment shown in FIG. 4, the upper half of the opening 112 is formed in the lower face of the wire retaining means 108. Thus, in the unit of FIG. 4, a portion of structure 108 is devoted to and forms part of the crystal holding structure. Again, the composite structure can comprise an assembly of sub-units as suits the fixture maker. One of the advantages of the invention is that the several means which comprise the inventive structure can be rearranged in sub-units of different forms.

Some means must be provided for introducing heat energy into the cavity, and that is done here by blowing in hot air. An entrance and exit opening for air must be provided and it is convenient to make that opening in the wire retaining structure 36, in the case of FIG. 2, and 108, in the case of FIG. 4. In this embodiment, the entrance opening is as wide and as long as the cavity in which the crystal is lodged. One entrance opening is visible in FIG. 4 and it is identified by the reference numeral 130. Corresponding heat entrance openings are visible in FIG. 2 where they are numbered 64 and 66, respectively.

The unit of FIG. 4, like that of FIG. 2, includes a means for urging the connector wires into contact with the crystal. That means comprises a series of cantilever springs one, 132, of which is visible. The springs are selectively cammed out of contact with the wires and are permitted to engage the wires by rotation of cam 134 which, as in the case of FIG. 2, comprises an elongated, cylindrical rod that has been flattened on one side. A means is provided for rotating the rod, and in the case of both units that means need be no more than a knob fixed to the end of the shaft. In the completed unit, the knob is fixed to both ends. One of those knobs is visible in FIG. 2 where it is identified by the reference numeral 68.

It is a feature of the invention to provide a means by which loading of the connector wires is facilitated. That is accomplished by providing a structure which extends upwardly from the upper surface of the wire holder in the region of each of the wire holding grooves, and the groove is continued through that structure so that a V-, or similarly shaped groove is formed in the structure. The apex of that V-shaped groove lies coincident with, or somewhat below, the groove with which it is associated in the upper face of the wire holding member. While a separate structure may be formed at each groove, it is preferred, and the illustrated embodiments include, a raised bar or rib that is formed integrally with the wire holding member and extends upwardly from its face. That extension is of uniform width and extends for the full length of the wire holding member in a direction parallel to its edges and perpendicular to the wire grooves. The structure is identified by the reference numeral 70 in FIG. 2 and 3, and the corresponding structures in FIG. 4 are identified by the reference numeral 140 at the right and 142 at the left of the crystal holding cavity. The lower face of the wire retaining member 38, in FIG. 2, and 108 in FIG. 4, is formed with an elongated recess in which those upwardly extending structures are disposed. The recess is deeper than the wire loading structure is high so that that structure prevents no interference to engagement of the upper surface of the wire holding member by the lower surface of the wire retainer. For identification, the recess in member 38 is identified with the reference numeral 72. The corresponding recesses in FIG. 4 are numbered 144 and 146.

The operation depicted in FIG. 1 is the last step in the bonding process. Prior to that step, the connector, or support, wires must be tinned with solder and before tinning, the wires are coated with flux to ensure proper tinning. The task of doing that is complicated by the fact that the wires are very small and of a metallic color that may make it difficult to distinguish which end of the wire has been fluxed and which has been tinned. That difficulty has been overcome in the past by employment of a procedure in which an operator, using a tweezer, picked up one of the wires, and, without releasing it, dipped it first in flux and then in the solder pot, and then placed it in some sort of wire bonding apparatus without previously releasing the wire from the tweezer. While that procedure does much to ensure that the soldered end of the wire is placed adjacent to the connection point, it does little to ensure uniformity in the fluxing and tinning process, and it is not very sufficient in terms of the time required to complete the operation. In the method of the invention, many wires are arranged so that they lie in a common place with an end of all of them extending in like degree whereby the ends of all lie along a common line. Thus arranged, the wires are dipped simultaneously into solder flux to a pre-gaged depth, and thereafter, all of the wires are dipped simultaneously to a pre-gaged depth in a body of molten solder where they are tinned. Those steps are accomplished using a fixture in which the wires can be held during both steps and in which they can be stored for any convenient period before being bonded to crystals in bonding apparatus, such, for example, as that shown in FIGS. 2 and 4.

A preferred apparatus for practicing those steps of the method is shown in FIG. 8. That apparatus is a wire holding fixture comprising a helically wound, coiled spring, and means for extending and compressing the coils of the spring. It includes a stop member or wire end locater which, in preferred form, comprises a bar extending in a direction parallel to the axis of the coiled spring. Wires are laid between pairs of the coils of the spring while the coils are stretched apart so that the ends of the wire rest against the stop. A series of wires, each placed between a respectively associated pair of adjacent spring turns is arranged so that all of them have their ends in engagement with that stop. By that arrangement it is possible to ensure that the ends of all of the wires lie in a common line so that they can be dipped together into flux and molten solder. To ensure that all of the wires lie in a common plane, a second stop is employed. The second stop is spaced from the first and is positioned so that a wire laid between a pair of spring turns rests in the common plane. A preferred form of such a structure is shown in FIG. 8.

The unit of FIG. 8 comprises a pair of end blocks 200 and 201 which are spanned by, and interconnected with, a cylindrical rod 202. In this particular embodiment the distance between the aixs of rod 202 and the lower face 204 of block 200 is the same as the distance from that axis to the lower face 206 of block 201. That arrangement is useful as will become apparent below.

A helically wound, coiled spring 210 is mounted upon the rod 202. In preferred form, the inside diameter of the spring is somewhat larger than the outside diameter of rod 202. One end of spring 210 is fixed to block 200, and the other end of the spring 210 is fixed to a block 212 which is provided with a bore through which the rod 202 extends. Block 212 is slidable along the rod 202, but it is provided with a set screw in the form of a thumb screw 214. It may be turned down to preclude relative movement between block 212 and rod 202, or it may be released so that the block may be moved along the rod whereby the spring 210 may be compressed or extended at will. In preferred form, the spring 210 is of the tension type in that its coils are closely wound in the relaxed condition of the spring. By backing off the thumb screw 214 and moving block 212 toward block 201, the spring is made to extend so that there is a space between adjacent turns or coils as illustrated in FIG. 8. With the spring in that condition, the thumb screw is turned down and the unit is placed on a stop fixture 216 in the manner shown in FIG. 9. That fixture is not shown in detail, because it essentially is only an elongated V-block, one surface of which is formed with an elongated groove 218 running parallel with the block. That same surface is provided with conformations at its ends in which to receive the lower surfaces 204 and 206 of the wire holding fixture of FIG. 8. In FIG. 9, only the wire holding fixture is shown in cross-section. The stop structure is shown in end elevation.

The assemblage is shown in top plan view in FIG. 10. A number of straight lengths of conductor wires have been placed so that their lower ends lie in the groove 218 of the stop fixture, and so that in the mid region of their length the wires lie between respectively associated pairs of adjacent turns of the spring 210. In the condition shown in FIG. 9, the block 212 has been moved to the left along the rod 202 so that the turns of the spring are compressed against the conductor wires. The conductor wires are pinched between their respectively associated spring turns, and since the lower ends of all of them are disposed in the slot 218, the lower ends of all of them lie in a common line. Since the lower block faces 204 and 206 are equidistant from the axis of the rod 208, the line on which the wire ends are disposed are parallel to the axis of the rod 202.

It is preferred that all of the connector wires lie in a common plane as well as to have their lower ends lying on a common line. To that end, a second stop is employed. In this embodiment, the surface of rod 202 serves as the second stop. That is not essential, of course. In another construction, the second stop might be another member.

FIG. 11 illustrates a flux receptical 230, the central region of which is recessed in the region 232 to provide a container for liquid flux material. The receptical 230 is provided with a recess at each end of the central recessed area, and those end recesses, 234 and 236, are spaced and of size to accommodate the blocks 204 and 206 of the wire holding fixture of FIG. 8. After the wires have been assembled on the fixture and the spring is released to pinch the wires as shown in FIG. 10, it is necessary only to pick up the wire holding fixture and place it on the fluxing receptical 230 with blocks 204 and 206 disposed in the recesses 234 and 236, respectively. The lower ends of the wires will be immersed in the liquid flux, and all of them will be immersed in like degree. That step is illustrated in FIG. 12 where the recess 232 is shown to be filled with a body of liquid flux material 238.

Following the fluxing step, the wire holding fixture may be set aside and the flux permitted to solidify or the fluxed wires may be taken to the next step immediately. It matters not whether the flux is wet or dry at the time that the wires are immersed into the body of solder in the solder pot 250, shown in FIG. 13. The solder has been omitted from the pot so that the construction of the pot can be more easily understood. In the preferred form shown, the solder pot is formed of a flat, generally rectangular base 252. The upper surface has portions milled away to provide a solder reservoir 254 and a scum reservoir 256 which is interconnected with the main reservoir 254 by a dam 258. The main reservoir communicates with a well 260. The level of solder in the main pot is controlled by raising and lowering a slug 262 which is mounted on a screw 264. The slug and the screw are held in line with the well 260 by an L-shaped bracket 266.

The upper face 270 of the base is formed with two recesses, one on each side of the main reservoir of the solder pot. Those recesses are identified by the reference numerals 272 at the right and 274 at the left of the main reservoir. They are of size to accommodate blocks 200 and 201 of the wire holding fixture. The fixture is shown assembled with the solder pot in FIG. 13, except that most of it has been omitted so that the solder pot will be more easily visible. However, a portion of the rod 202 and of spring 210 and some of the connector wires are shown to illustrate that the lower ends of the connector wires extend down into the body of solder that is to be contained in the pot. It will be apparent that only the lower end of the wire will be tinned and that all of them will be tinned in like degree.

One of the advantages of the wire holder of FIG. 8 is that it is reversable. That feature will be apparent from a comparison of FIGS. 9 and 12. In FIG. 9, the wires have been assembled on one side of the rod 202, and in FIG. 12, they have been assembled on the other side of the rod. In FIG. 9, the end wire is designated 280, and in FIG. 12, the end wire is designated 282.

Although I have shown and described certain specific embodiments of my invention, I am fully aware that many modifications thereof are possible. My invention, therefore, is not to be restricted except insofar as is necessitated by the prior art.

I claim:

1. Apparatus for use in bonding conductors to connection points on electrical elements, comprising in combination:
    a. conductor holding means in the form of a member formed with cutouts in which a conductor may be held;
    b. conductor retaining means capable of overlying said conductor holding means for retaining said conductor in said cutouts while permitting longitudinal movement thereof relative to said conductor holding means;
    c. element holding means for holding an electrical element having a connection point such that said connection point lies in the path of longitudinal movement of a conductor being retained in said holding means; and
    d. urging means for urging a conductor being retained in said holding means to move longitudinally relative to said conductor holding means such that an end portion of the conductor is in engagement with said connection point of the element.

2. The invention defined in claim 1 in which said cutouts are each formed as a groove over at least a portion of their length.

3. The invention defined in claim 2 in which said conductor holding means further comprises a conductor holding surface having a projecting portion projecting from an intermediate region of said surface, said groove being formed in said projecting portion and having generally V-shape.

4. The invention defined in claim 3 in which said retaining means comprises two portions capable of straddling the projecting portion of the conductor holding means and capable of overlying portions of a conductor on either side of said projecting portion.

5. The invention defined in claim 1 in which said element holding means is fixed to one of said conductor holder and said conductor retaining means.

6. The invention defined in claim 1 in which said element holding means includes a cavity and means for holding said electric element such that said connection points are disposed in said cavity.

7. Apparatus for use in bonding conductors to connection points on electrical elements, comprising in combination:
   a. conductor holding means in the form of a member formed with cutouts in which a conductor may be held;
   b. conductor retaining means capable of overlying said conductor holding means for retaining said conductor in said cutouts while permitting longitudinal movement thereof;
   c. element holding means for holding an electrical element having a connection point such that said connection point lies in the path of longitudinal movement of a conductor being retained in said holding means; and
   d. urging means for urging a conductor being retained in said holding means to move longitudinally such that an end portion of the conductor is in engagement with said connection point of the element;
   e. said conductor holding means comprising a plate having an upper surface in which a plurality of parallel, conductor holding grooves are formed;
   f. said element holder comprising a member fixed relative to said conductor holder and formed to receive an electrical element in position to be engaged by a conductor which is moved longitudinally in one of said grooves of the conductor holding means;
   g. said conductor retaining means comprising an element overlying said upper surface of said plate such as to engage either said upper surface or the conductors disposed in said grooves whereby said conductors are trapped against any substantial degree of movement except in the direction along said grooves.

8. The invention defined in claim 7 in which said conductor holder further comprises means in the form of a cavity in which the electrical element may be held, for permitting flow of heated air around the element in the region of said connection point.

9. The invention defined in claim 8 in which said conductor retaining means overlies the cavity of said element holding means and is formed with an air inlet passageway communicating with the cavity of said element retaining means.

10. The invention defined in claim 7 which further comprises a structure rising upwardly from said upper surface of the plate at each of said grooves at a point intermediate the ends of said grooves and being formed with generally V-shaped grooves the bottoms of which are coincident with the grooves of said upper surface.

11. The invention defined in claim 11 in which said conductor retaining means is formed with a recess of size to accommodate said structure such that the lower surface of said conductor retaining means straddles said structure and overlies the upper surface of said plate on opposite sides of said structure.

12. The invention defined in claim 7 in which said urging means comprises a plurality of cantilever springs, one associated with and located at the end of each of said groove of the conductor holding means.

13. The invention defined in claim 12 which further comprises means for moving said cantilever springs togehter from a position in which they are precluded from engaging conductors disposed in said grooves to a position in which they are free to bear against respectively associated conductors.

* * * * *